United States Patent [19]

Takagi

[11] Patent Number: 5,169,453
[45] Date of Patent: Dec. 8, 1992

[54] WAFER SUPPORTING JIG AND A DECOMPRESSED GAS PHASE GROWTH METHOD USING SUCH A JIG

[75] Inventor: Youji Takagi, Yokohama, Japan

[73] Assignee: Toyoko Kagaku Co., Ltd., Kawasaki, Japan

[21] Appl. No.: 700,945

[22] Filed: May 14, 1991

Related U.S. Application Data

[63] Continuation of Ser. No. 388,962, Aug. 1, 1989, abandoned.

[30] Foreign Application Priority Data

Mar. 20, 1989 [JP] Japan .................. 1-30891(U)

[51] Int. Cl.⁵ .................. B05C 13/02; H01L 21/31; H01L 21/205
[52] U.S. Cl. .................. 118/728; 437/925; 118/726; 118/500
[58] Field of Search ........... 148/DIG. 6, DIG. 41, 148/DIG. 57; 437/81, 105, 107, 102, 104, 247, 925, 949, 971; 156/610, 611, 612, 613, 614; 427/248.1, 255, 255.1, 255.2; 118/715, 718, 719, 720, 728, 500

[56] References Cited

U.S. PATENT DOCUMENTS

| 3,493,444 | 2/1970 | Sirtl et al. | 437/925 |
| 3,511,723 | 5/1970 | Bard | 437/925 |
| 4,113,547 | 9/1978 | Katz et al. | 156/612 |
| 4,141,764 | 2/1979 | Authier et al. | 437/925 |
| 4,589,369 | 5/1986 | Mahler | 118/728 |
| 4,592,308 | 6/1986 | Shih et al. | 118/726 |
| 4,877,573 | 10/1989 | Nilsson | 118/728 |
| 5,054,418 | 10/1991 | Thompson et al. | 118/728 |

FOREIGN PATENT DOCUMENTS

| 0005380 | 1/1979 | Japan | 437/925 |
| 1106768 | 5/1986 | Japan | 118/728 |
| 1201695 | 9/1986 | Japan | 156/613 |
| 0224337 | 10/1986 | Japan | 118/728 |
| 0292336 | 12/1986 | Japan | 156/610 |
| 0004337 | 1/1987 | Japan | 437/925 |
| 0012118 | 1/1987 | Japan | 437/105 |
| 0014415 | 1/1987 | Japan | 118/726 |
| 3620223 | 1/1987 | Japan | 118/728 |
| 0229932 | 10/1987 | Japan | 437/925 |
| 0279624 | 12/1987 | Japan | 118/728 |
| 1-168030 | 7/1989 | Japan . | |

*Primary Examiner*—Mary Wilczewski
*Attorney, Agent, or Firm*—Armstrong & Kubovcik

[57] ABSTRACT

A wafer supporting jig that allows formation of a film with an even thickness on a wafer as well as a decompressed gas-phase growth method utilizing such a jig.

A wafer supporting jig according to the invention is realized in the form of a ring made of a heat-resistive material having a central opening.

6 Claims, 8 Drawing Sheets

WAFER SUPPORTING JIG AND A DECOMPRESSED GAS PHASE GROWTH METHOD USING SUCH A JIG

This application is a continuation of application Ser. No. 388,962 filed Aug. 1, 1989, now abandoned.

BACKGROUND OF THE INVENTION

This invention relates to a wafer supporting jig and a decompressed gas phase method using such a jig for evenly growing a nitride film ($Si_3N_4$), a low temperature oxide film (LTO), a high temperature oxide film (HTO), a phosphor glass (PSG) film, a boron phosphor glass (BPSG) film, a refractory metal film, a metal silicide film, a Si-Ge epitaxial growth film or a III-V or II-IV group epitaxial growth film on a substrate wafer to be used for a semiconductor device.

Decompressed gas phase growth apparatus are popularly used in the semiconductor manufacturing industry for growing oxide or nitride films on substrate wafers. Such known apparatus are generally categorized into two groups; a horizontal type apparatus as illustrated in FIG. 14 which comprises a horizontally arranged oblong reaction tube 1 surrounded by a heater 2, wherein a number of wafers 3 are vertically arranged on so many wafer boats 4 and gas flows in the tube as it is introduced from the gas inlet port 5 of a flange connected with said reactor tube and ejected from the outlet port 6 and a vertical type apparatus as illustrated in FIG. 15 which comprises a vertically arranged reactor tube 1, surrounded by a heater 2', wherein a number of substrate wafers 3, are horizontally arranged on so many wafer boats 4' and gas flows in the tube as it is introduced from the gas inlet port 5' located at the upper or lower end of the reaction tube and ejected from the outlet port 6'. The method of growing oxide and/or nitride films by using silane gas ($SiH_4$) in these known gas phase growth apparatus is accompanied by the drawback of producing wafers with too thick edge portions and the difficulty with which evenly thick films are formed. In order to bypass these drawbacks, boats are usually realized in the form of cylinders provided with a large number of bores, each boat (which is popularly called a gage boat according to the well-known trade name) is formed by two halves which can be separated for ease of introducing and taking out wafers by using a pair of pincers. However, the above described known method obviously lacks efficiency and deters the way for automation. Moreover, the method is accompanied by the problem of introducing dirt when the boat is opened, which eventually sticks to the wafers.

BRIEF SUMMARY OF THE INVENTION

It is therefore an object of the present invention to provide a wafer supporting jig and a decompressed gas phase growth method using such a jig.

It is another object of the present invention to provide a wafer supporting jig that allows automatic introduction and ejection of wafers by raising the wafers by means of a thin plate-formed wafer chuck and a decompressed gas phase growth method using such a jig.

Other objects and the advantages of the present invention will become clear in the course of the following description which is made by referring to the accompanying drawings which illustrate preferred embodiments of the invention.

DETAILED DESCRIPTION OF THE INVENTION

A jig according to the invention is characterized by that it is realized in the form of a ring made of a heat-resistive material having a central opening.

A ring-shaped jig according to the invention is also characterized by that it is rigidly secured to a support pillar and substrate wafers are so arranged that they face vis-a-vis the ring-shaped jig to grow films in a gas phase in the reaction tube.

The effects of the present invention derive from the fact that since the substrate wafers are so arranged that they face vis-a-vis the ring-shaped jig, the temperature of the edges of the wafers is reduced and films are evenly formed on the wafers, whereas the conventional method does not allow even dispersion of the gas on the central areas of the wafers and consequently forms films having thick portions at the edge areas of the wafers.

Figure 1:
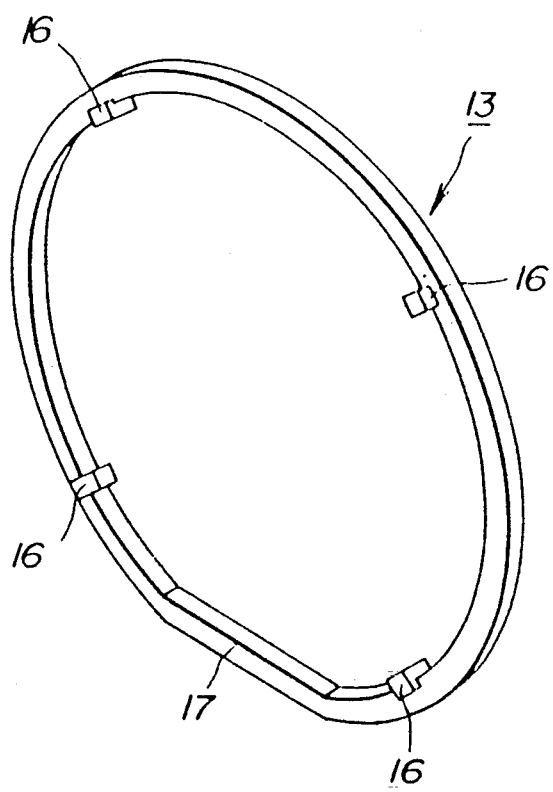
FIG. 1 is a perspective view of an embodiment of the invention.
Figure 2:
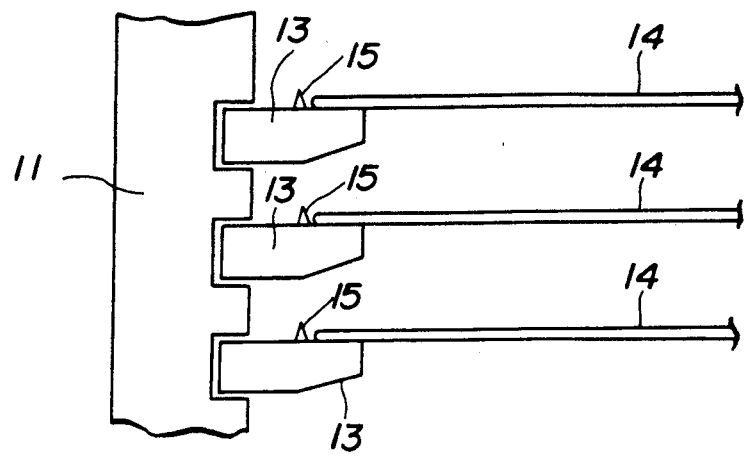
FIGS. 2 through 9 are so many side views illustrating other embodiments of the invention.
Figure 3:
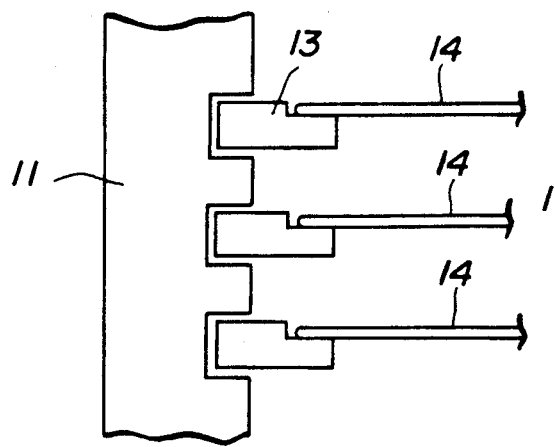
Figure 4:
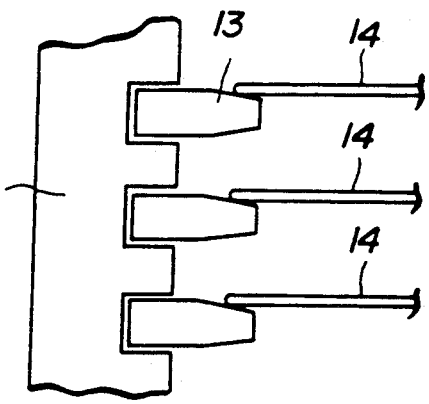
Figure 5:
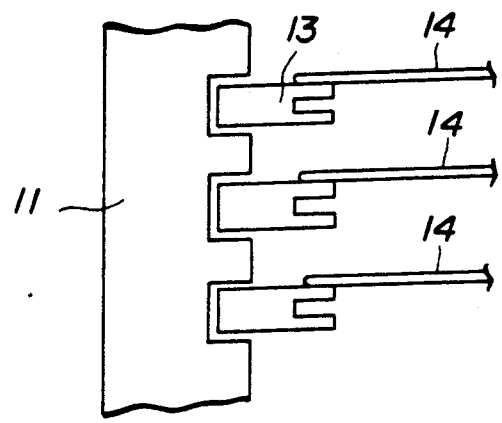
Figure 6:
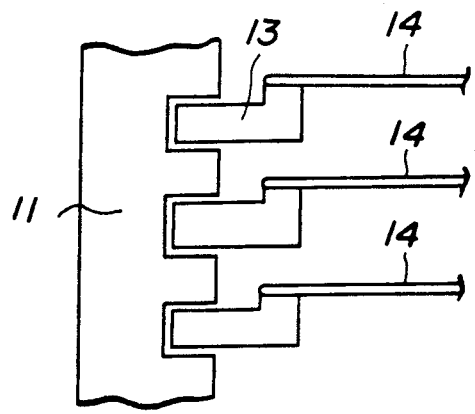
Figure 7:
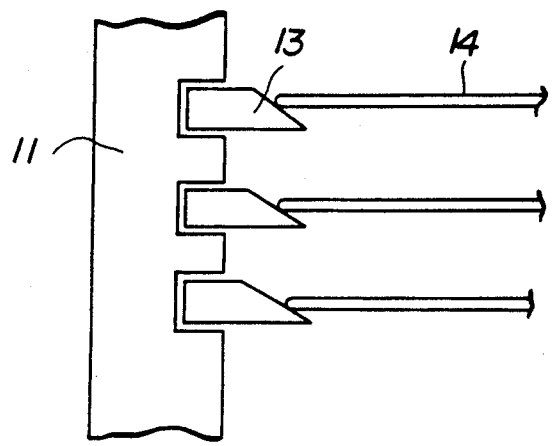
Figure 8:
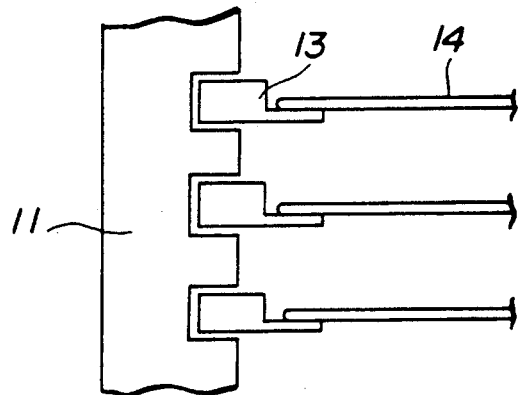
Figure 9:
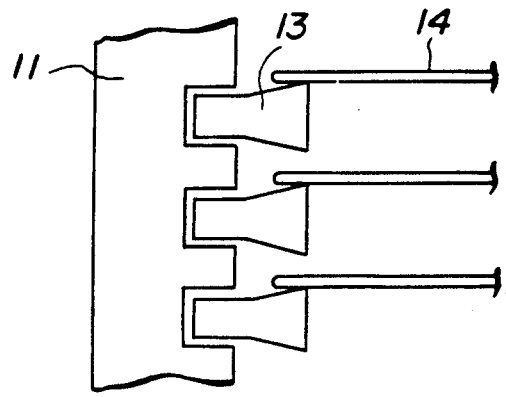

FIG. 1 of the accompanying drawings illustrates a perspective view of a jig according to the invention, wherein the jig 13 is roughly formed in the shape of a ring having a central opening and provided with a number of projections 16 for supporting wafers.

With such an arrangement, spaces are formed between the roughly ring-shaped jig and the wafers supported by the projections 16 such that a thin plate may be inserted through the spaces to automatically transfer the wafers rigidly held on it by vacuum suctioning. Said ring-shaped jig comprises a straight portion 17 provided for alignment of the jig and the oriented flat areas for the crystal axis of the wafers in view of formation of films which are grown evenly including the oriented flat areas. The thin plate for vacuum suctioning may be introduced and ejected through the straight portion 17 or the opposed portion of the ring-shaped jig.

The materials that can be used for a ring-shaped jig according to the invention include, but are not limited to, heat resistive materials such as quartz glass, silicon carbide (SiC), alumina ($Al_2O_3$) and ceramics.

A ring-shaped jig 13 may take any form so long as it is realized in the form of a ring having a central opening. FIGS. 2 through 9 illustrate eight different preferred embodiments. Reference numeral 15 in FIG. 2 denotes antiskid projections, which are not by any means a prerequisite for such a jig.

Figure 10:
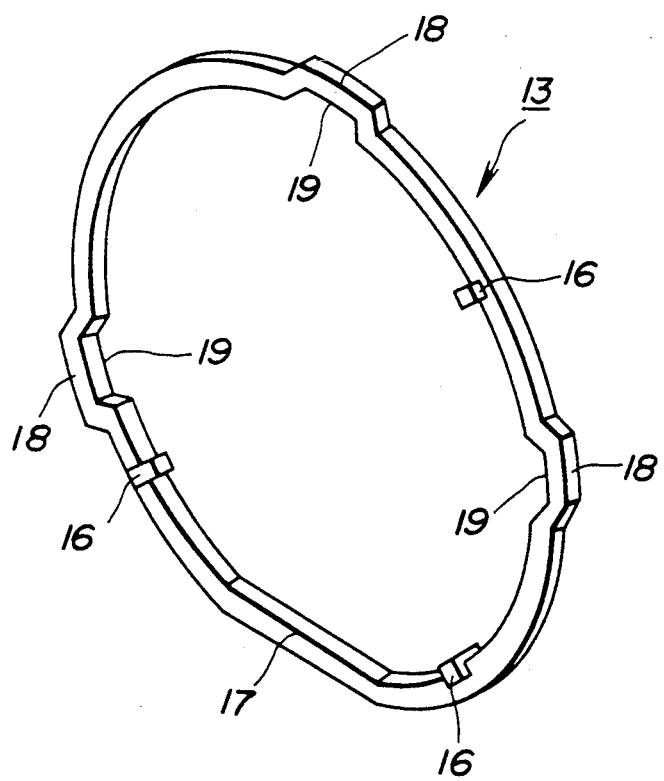
FIG. 10 is a perspective view of another embodiment of the invention.

FIG. 10 shows a perspective view of another embodiment of the invention comprising three outward projections 18 which are rigidly fitted to a support pillar 11.

Each of the projections 18 has a recessed inner surface 19, which contributes to reduce the influence of the support pillar and form thin films having an even thickness.

Now a decompressed gas phase growth method using a ring-shaped jig as above will be described.

Figure 11:
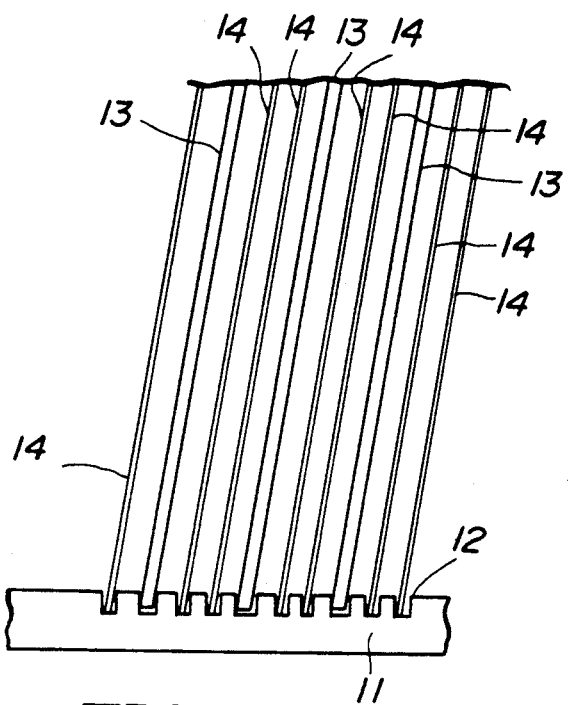
FIGS. 11 and 12 are side views of an embodiment of the invention applied to a horizontal type decompressed gas phase growth apparatus.

FIG. 11 is a side view of a jig as it is applied to a horizontal type decompression apparatus, wherein ring-shaped jigs 13 according to the invention are rigidly fitted to the corresponding grooves 12 of a support pillar 11, a pair of wafers 14 being similarly fitted to the corresponding grooves 12 of the support pillar in such a manner that the wafers 14 face vis-a-vis the related ring-shaped jigs 13.

Figure 12:
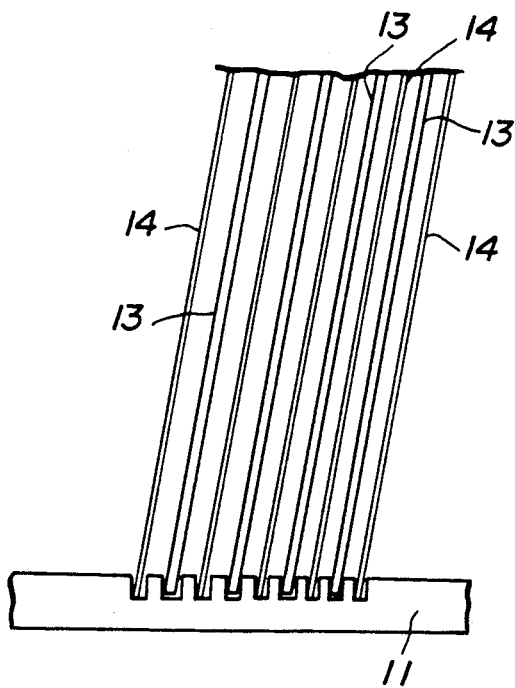

FIG. 12 shows an example where only one wafer 14 is supported between a pair of ring-shaped jigs 13. Since all the wafers 14 face a same direction in this example, they do not require any reversing operation when they are retracted from the support pillar.

While each of the above embodiments comprises three support pillars and hence the ring-shaped jigs 13 and the wafers 14 are supported at three different points, the number of pillars are not necessarily limited to and may be greater than three, although the number of pillars greater than three does not bring forth any additional advantages. The ring-shaped jigs are rigidly fitted to the grooves of the support pillars 11 by welding or other bonding techniques, which provide a further advantage of inseparability when the support pillar-jig assembly is subjected to washing.

Wafers as illustrated in FIGS. 11 and 12 may be subjected to a known process of formation of oxide or nitride films in a horizontal decompressed gas phase growth apparatus.

Figure 13:
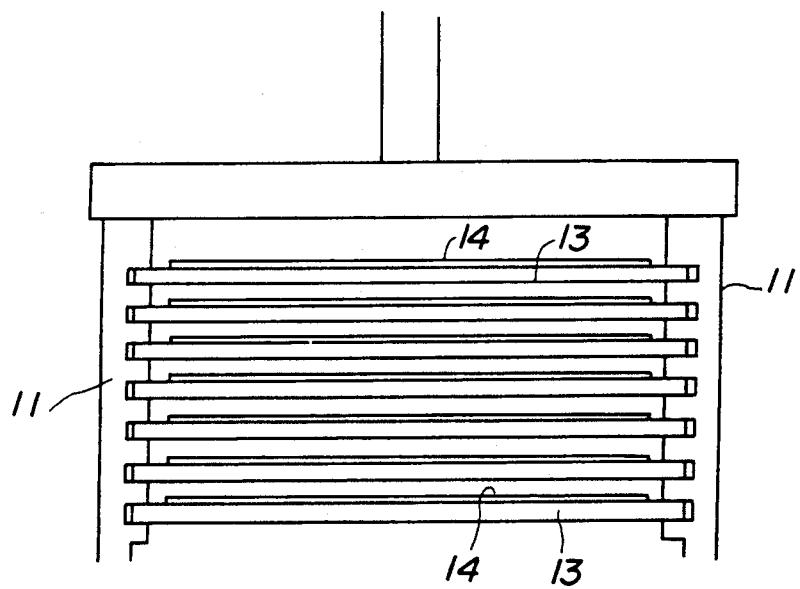
FIG. 13 is a side view of an embodiment of the invention applied to a vertical type decompressed gas phase growth apparatus.
Figure 14:
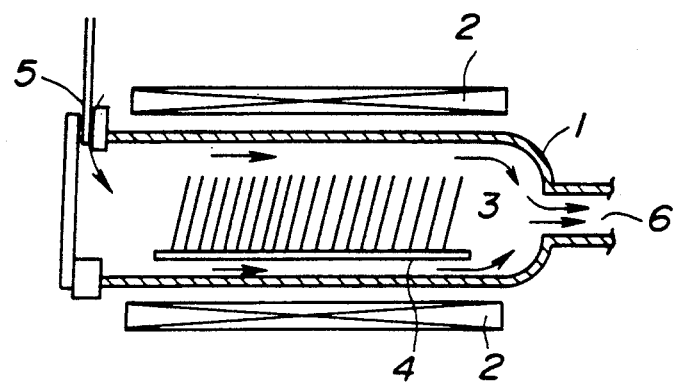
FIG. 14 is a sectional view of a conventional horizontal type decompressed gas phase growth apparatus.
Figure 15:
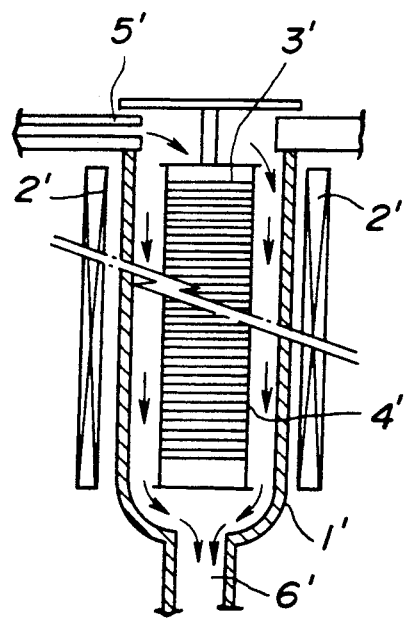
FIG. 15 is a sectional view of a conventional vertical type decompressed gas phase growth apparatus.

FIG. 13 illustrates ring-shaped jigs 13 rigidly fitted to a support pillar 11 of a vertical type decompression apparatus for supporting wafers 14. It should be noted that such an arrangement allows rotation of the wafer boat.

When oxide or nitride films are formed in such an arrangement, the films grow evenly on the wafers as the edge portions provide lower temperatures.

As is apparent from the above description, since the surface of a wafer facing a ring-shaped jig according to the invention allows gas-phase growth and retards any decomposition of the reaction gases in the peripheral area of the wafer as the area is relatively cooled, a evenly thick film is formed on the wafer even under a condition that favors formation of a film having a thick peripheral area. Moreover, projections formed on the upper surface of a ring-shaped jig for supporting wafers allows automatic transfer of the wafers located on the supporting projections by simply lifting the wafer chuck of a thin plate.

What is claimed is:

1. A device adapted for use in decompressed gas phase growth method where a gas is introduced into a reaction tube containing a wafer having an orientation flat portion and the reaction tube is heated from the exterior so as to grow a thin film on the wafer, said device comprising a wafer supporting ring-shaped jig maintained on a pillar, said jig being in the general form of a continuous ring with central opening, being of a substantially circular form with a straight portion adapted to be fitted to the orientation flat portion of the wafer, and being made of heat resistive material, an upper surface of said ring-shaped jig having a plurality of wafer supporting projections for supporting a wafer on said ring-shaped jig with spaces therebetween such that a substantially uniform thin film can be grown on the wafer.

2. A device according to claim 1, having projections formed on a plurality of spots on said ring-shaped jig, each of said projections having a recessed inner surface to held reduce the influence of a support pillar and form thin films having an even thickness during the gas phase growth method.

3. A device according to claim 1, wherein said ring-shaped jig is made of a heat resistive material selected from silicon carbide (SiC), alumina ($Al_2O_3$) and ceramics.

4. A device according to claim 1 wherein the central opening of said ring-shaped jig is of a dimension significantly greater than the thickness of said jig.

5. A device according to claim 1, wherein the ring-shaped jig has a thickness which is less than the diameter of the central opening.

6. A device according to claim 1, wherein the central opening of the ring-shaped jig has an axis and the thickness of the ring-shaped jig in a direction parallel to the axis is significantly less than a dimension of the central opening perpendicular to the axis.

* * * * *